United States Patent [19]

Young

[11] Patent Number: 4,743,831
[45] Date of Patent: May 10, 1988

[54] APPARATUS AND METHOD FOR INDICATING REMAINING BATTERY LIFE IN A BATTERY POWERED DEVICE

[75] Inventor: James E. Young, Youngsville, N.C.

[73] Assignee: Troxler Electronic Laboratories, Inc., Research Triangle Park, N.C.

[21] Appl. No.: 906,543

[22] Filed: Sep. 12, 1986

[51] Int. Cl.$^4$ .................. H02J 7/00; G08B 21/00
[52] U.S. Cl. ........................ 320/48; 320/14; 320/38; 340/636
[58] Field of Search .............. 320/2, 38, 43, 44, 48, 320/61, 14, 37; 340/636

[56] References Cited

U.S. PATENT DOCUMENTS

| | | | |
|---|---|---|---|
| 3,118,137 | 1/1964 | Vincent | 340/636 |
| 3,234,538 | 2/1966 | Parke | 340/636 |
| 3,593,099 | 7/1971 | Scholl | 320/13 |
| 3,786,342 | 1/1974 | Molyneux | 340/636 X |
| 4,027,231 | 5/1977 | Lohrmann | 320/48 X |
| 4,216,648 | 8/1980 | Maire | 340/636 X |
| 4,316,185 | 2/1982 | Watrous | 340/636 |
| 4,367,422 | 1/1983 | Leslie | 340/636 X |
| 4,380,726 | 4/1983 | Sado et al. | 320/13 X |
| 4,525,055 | 6/1985 | Yokoo | 320/48 X |
| 4,553,081 | 11/1985 | Koenck | 320/43 |
| 4,638,237 | 1/1987 | Fernandez | 320/43 X |

Primary Examiner—R. J. Hickey
Attorney, Agent, or Firm—Bell, Seltzer, Park & Gibson

[57] ABSTRACT

The remaining battery life of a battery powered device is predicted by monitoring the immediate past history of battery life and employing this immediate past history as a basis for subsequent predictions of the useful life of the battery. By this approach, the present invention is able to take into account the deterioration of battery life which occurs during the life-time of a rechargeable battery. The device includes a data storage means for storing a predetermined value representing the total number of usable hours to be expected to obtain from a fully charged battery during normal use, means for counting the number of hours of actual use of the battery, and means operable in response to the occurrence of a full discharge of the battery in normal use for updating the data storage means to store therein as the predetermined value for the expected useful life of the battery in the next cycle of normal use, the value for the number of hours of use actually obtained from the battery in the current cycle, so that subsequent predictions of the battery life will be based upon the immediate past history of actual battery life.

7 Claims, 2 Drawing Sheets

APPARATUS AND METHOD FOR INDICATING REMAINING BATTERY LIFE IN A BATTERY POWERED DEVICE

FIELD AND BACKGROUND OF THE INVENTION

This invention relates to a battery powered device, and more particularly to an apparatus and method for predicting and indicating the number of remaining hours that the device can be operated until the battery must be replaced or recharged.

In many applications where portable battery powered devices are used, it is desirable to have an advance indication of the amount of remaining battery life in the device so that the user will know how much longer he can use the device before it is necessary to stop and either replace or recharge the batteries. Several prior patents, such as U.S. Pat. Nos. 3,118,137; 4,525,055; and 4,553,081, for example, disclose battery powered devices which are equipped with circuits or methods to indicate remaining battery life. However, the devices described in these patents employ somewhat complicated and specialized means for providing an indication of remaining battery life, which would be inconvenient or undesirably expensive to implement in many applications. Moreover, many of the prior approaches to providing an indication of remaining battery life do not take into account the fact that the expected useful life of a rechargeable battery changes during its lifetime after repeated discharge-recharge cycles.

With the foregoing in mind, it is an object of the present invention to provide a simple, inexpensive and easily implemented apparatus and method for predicting the remaining useful life of the battery in a battery powered device.

A further object of the present invention is to provide an apparatus and method of the type described which takes into account the deterioration of the useful battery life over the lifetime of the battery.

A further object of the invention is to provide a battery life prediction apparatus and method of the type described which makes use of a microprocessor already provided in the device itself so as to minimize the need for additional parts.

SUMMARY OF THE INVENTION

The present invention predicts the remaining battery life of a battery powered device by monitoring the immediate past history of the battery life and employing this immediate past history as a basis for subsequent predictions of the useful life of the battery. By this approach, the apparatus and method of the present invention continually "teaches" itself and is able to take into account the deterioration of the useful battery life which inherently occurs during the lifetime of the battery.

More specifically, the present invention is directed to a portable battery powered system which includes a portable battery powered device and a battery connected to the device for supplying electrical power thereto, wherein there is provided, in combination with the battery powered device, an apparatus for predicting the remaining useful life of the battery during the discharge cycle of the battery, which apparatus comprising:

data storage means for storing a predetermined value representing the total number of usable hours expected to be obtained from a fully charged battery during a normal use discharge cycle, means for counting the number of hours of actual use of the battery, means for comparing the number of hours of actual battery use with said stored predetermined value to determine the number of hours of usable battery life remaining, means for displaying the thus determined remaining usable battery life, and means operable in response to the occurrence of a full discharge cycle of the battery in normal use for updating said data storage means to store therein as said predetermined value for the expected useful life of the battery, the value for the number of hours of use actually obtained from the battery in the current discharge cycle, so that subsequent predictions of battery life will be based upon the immediate past history of actual battery life.

The invention may be advantageously embodied in a portable battery powered device which utilizes a microprocessor as part of its operation. In this instance, the battery life prediction of present invention may be implemented by the same microprocessor which is employed for carrying out the operating functions of the battery powered device. This is accomplished through the use of a subroutine which is executed in the microprocessor upon demand or when the device is in a particular state, e.g. a ready or idle state.

The invention is applicable for use in various kinds of battery powered devices such as for example, computers, calculators, portable data collection devices, and portable measurement instruments.

BRIEF DESCRIPTION OF THE DRAWINGS

Some of the features and advantages of the invention having been stated, others will become apparent as the description proceeds, when taken in connection with the accompanying drawings, in which.

DESCRIPTION OF THE ILLUSTRATED EMBODIMENT

The present invention will be understood more fully from the description which follows, in which a particular embodiment of the invention is shown. It is to be understood at the outset, however, that persons of skill in the appropriate arts may modify the invention here described while still achieving the favorable results of this invention. Accordingly, the description which follows is to be understood as a broad teaching disclosure directed to persons of skill in the appropriate arts, and is not to be understood as limiting upon the present invention.

In the accompanying drawings and the description which follows, the present invention is shown and described as applied to a portable battery powered measurement instrument in the form of a nuclear density gauge. The gauge may be used to measure the density of an underlying test material, such as soil or pavement. However, it will be recognized that the present invention may be utilized in various other kinds of battery powered devices and may be quite efficiently and economically applied to battery powered devices which utilize a microprocessor, such as computers, calculators, portable data collection devices, cameras, portable communication devices such as radios or telephones, and various kinds of instruments.

Figure 1:
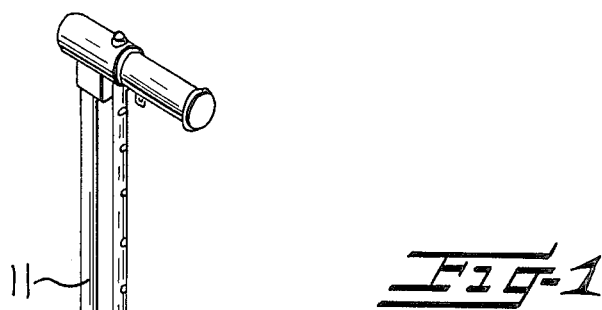
FIG. 1 is a perspective view of a portable battery powered measurement instrument embodying the present invention.

As shown in FIG. 1, the nuclear density gauge 10 includes a probe 11 which contains a radioactive source for emitting gamma radiation into the test material. Detectors located within the housing of the gauge 10 detect gamma radiation which passes from the source through the test material. Through a series of calculations carried out by a microprocessor housed within the gauge, the level of gamma radiation detected by the gauge is converted into a density reading, and the results are displayed on a suitable display device 12, such as a liquid crystal display. The gauge is powered by a set of rechargeable nickel-cadmium batteries, also located within the housing of the gauge. The specific method and circuits by which the nuclear gauge obtains its density reading are known in the art, and in any event are not required for an understanding of the present invention. A further explanation of the operation of this type of nuclear density gauge is contained in commonly-owned U.S. Pat. Nos. 3,544,793; 4,525,854; and 4,587,623.

When the gauge is in the idle or ready mode, the estimated remaining battery life is displayed on the display device 12. By pressing appropriate keys on the keyboard 13, the operator can place the gauge in the measurement mode and take a density measurement of the test material. Upon completion of the measurement, the density reading will be shown on the display. The gauge can then be returned to the ready mode in preparation for taking another reading, and the remaining battery life will again be shown on the display.

In the operation of a battery powered device, such as the battery powered gauge 10 illustrated in FIG. 1, the batteries are initially charged for a period of time until they reach a fully charged condition. In the illustration shown in the graphic time line representation of FIG. 2, the batteries are initially charged for a recommended charging time of 16 hours. With the batteries fully charged, the device is then placed into service. The measurement instrument may be operated continuously or intermittently until the batteries become discharged to the point that recharging of the batteries is required. The measurement instrument is provided with a battery low indicator which continually monitors the output voltage of the battery and causes a battery low indicator to appear on the display 12 when the output voltages drops to a predetermined minimum usable level. Preferably, the predetermined voltage which initiates the battery low indicator is set at a level so that the indicator will appear several hours prior to a fully discharged condition. This allows the operator to complete a particular measurement operation currently in progress before stopping to recharge the batteries.

Figure 2:
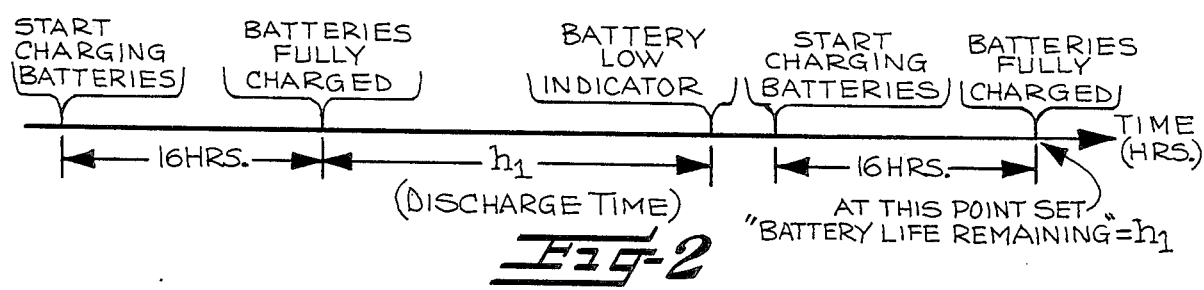
FIG. 2 is a graphic representation in the form of a time line illustrating the sequence of operations employed in carrying out the present invention.

During the operation of the gauge, the number of hours of operation is continually monitored and the total operating time, or discharge time, is represented in FIG. 2 as $h_1$. The batteries are then recharged, again for the recommended recharging time of 16 hours.

The present invention predicts the remaining battery life by employing the immediate past history of the battery life as a predictor of the expected battery life for the next discharge cycle. Thus, as is indicated in FIG. 2, upon the completion of the operation of the device to a fully discharged condition, the expected battery life for the subsequent discharge cycle will be set to equal to overall discharge time $h_1$ from the justfinished discharge cycle. During the discharge cycle, the hours of operation are continually counted and are subtracted from the predetermined value for the expected battery life to arrive at the current estimate of the remaining battery life. This is displayed on the machine as the hours count down.

One of the advantages of this system over other systems is the ability to accurately take into account the deterioration of the useful battery life which occurs over the lifetime of a battery. Typically, a rechargeable battery, such as a rechargeable Ni-Cad battery, will be capable of a large number of consecutive discharge-recharge cycles. However, after each recharge, the number hours of useful service from a fully charged condition to a minimum voltage condition diminishes. The present invention is able to accurately take into account this kind of deterioration, since after each discharge cycle the expected life of the battery is updated to reflect the immediate past history of actual battery life.

This system also works effectively after the batteries are replaced with new batteries. When the new, longer battery life is sensed at the end of a discharge cycle, the subsequent battery life prediction will reflect the longer expected life of the new batteries.

This system is also used for when nonrechargeable batteries are used. In this instance, the battery life monitoring will be updated when the old batteries are replaced with new batteries of the same type, and the prediction would be based upon the assumption that the new batteries would have a lifetime comparable to that of the old batteries which were just replaced.

A particularly advantageous feature of the present invention is that it requires very few components in addition to those already provided in the device. As earlier noted, the nuclear measurement gauge 10 utilizes a battery powered microprocessor for carrying out the calculations during the measurement mode. The same microprocessor can be utilized for carrying out the battery life prediction.

Figure 3:
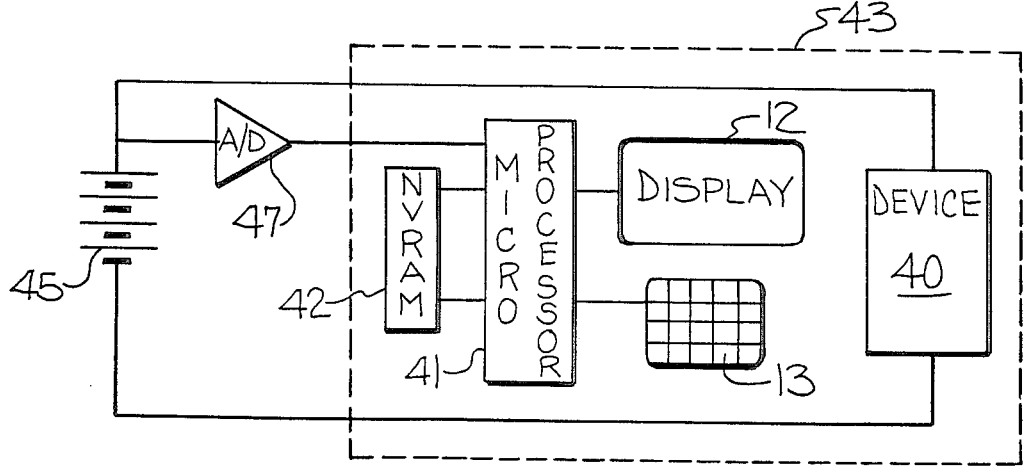
FIG. 3 is a schematic wiring diagram of an apparatus in accordance with the invention.

A suitable curcuit for carrying out the present invention is illustrated in FIG. 3. The box indicated by the reference 40 represents the portable battery powered device. The microprocessor is indicated by the reference character 41, and the reference character 42 represents a non-volatile random access memory (NVRAM) device or "memory chip" associated with the microprocessor and utilized for storing data for the microprocessor. The broken lines indicated by the reference character 43 and which surround the box 40 and the microprocessor 41 and associated memory represent that the microprocessor can be a part of the battery powered device itself. The battery utilized for powering the battery powered device is indicated at 45. The battery output voltage is fed as input to an analog to digital converter 47 which converts the analog battery voltage into a digital value, which in turn is supplied as an input to the microprocessor 41.

Figure 4:
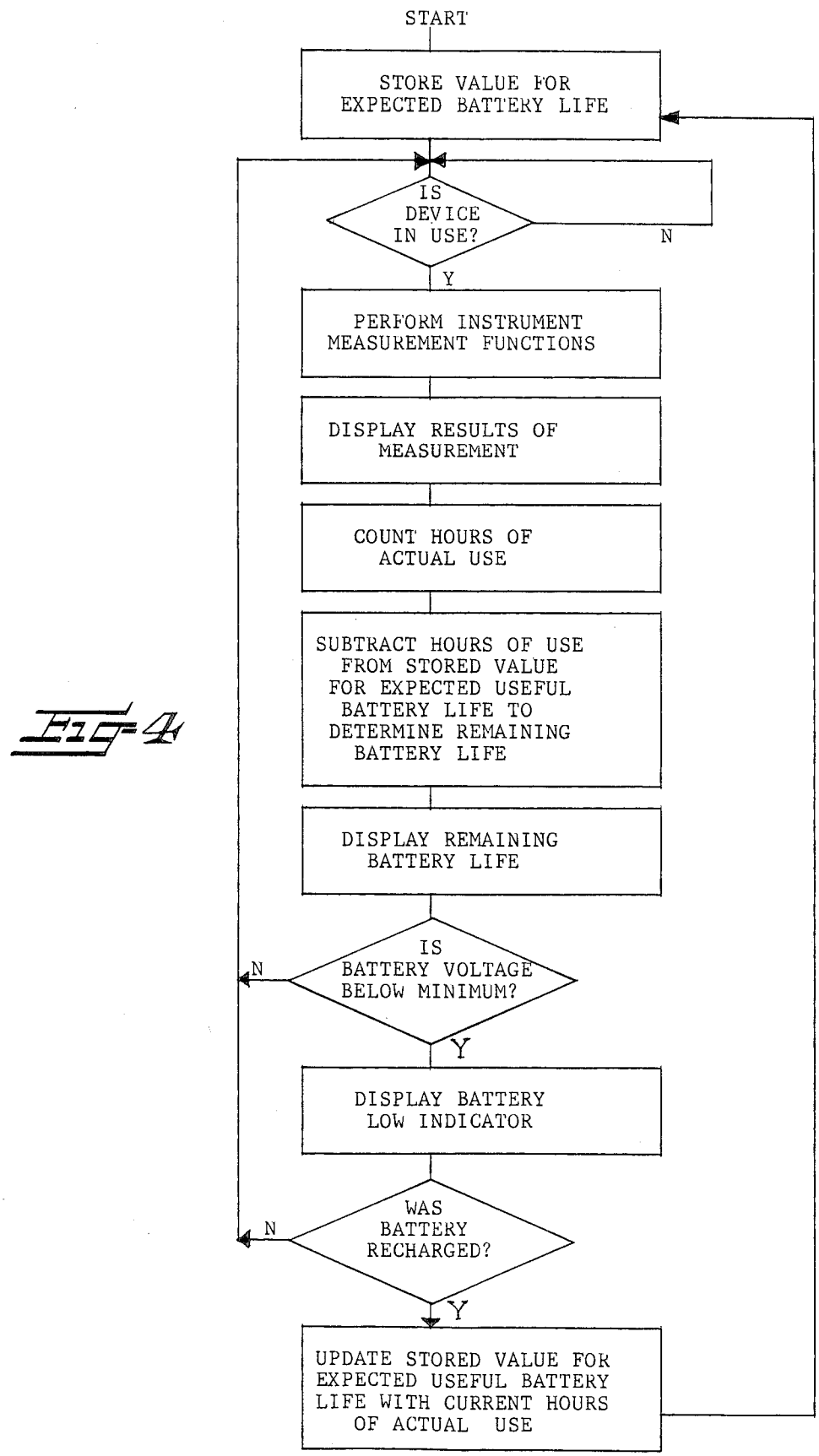
FIG. 4 is a block flow diagram illustrating the logic and a typical sequence of operations employed in carried out the present invention.

FIG. 4 provides a flowchart which illustrates the logic and the sequence of operations carried out in predicting remaining battery life in accordance with the present invention. From this flowchart and the accompanying description, one of ordinary skill in the art can construct a program in the form of a set of instructions for use by the microprocessor in carrying out the present invention.

Referring now more fully to FIG. 4, it will be seen that the present invention operates in an endless loop in conjunction with the other functions being carried out by the measurement instrument or other specific device. The sequence of operations are as follows:

During the operation of the device the number of hours of actual use are counted. The hours of actual use are subtracted from a predetermined stored value for the expected useful battery life in order to arrive at a value for the battery life remaining. The remaining battery life is displayed on the display 12. The battery voltage is continually monitored to determine whether it falls to a predetermined minimum value which is indicative that the battery is approaching the end of its life and recharging is required. So long as the battery voltage is above this predetermined minimum, the above sequence of operations are repeated. Once the battery voltage drops to the predetermined minimum level, the battery low indicator is displayed on the display device. When the batteries are recharged, the stored value for the expected useful battery life is updated by replacing the previously stored value with the value for the number of hours of actual use obtained during the current discharge cycle. This value will then be used in subsequent predictions of battery life so that subsequent predictions of battery life will be based upon the immediate past history of actual battery life.

Preferably, the updating step is carried out only in response to a substantially complete discharge cycle. Thus, if the batteries were recharged after only a short period of use such that the batteries were only partially discharged, no updating would occur and the previously stored estimate of usable battery life would be maintained and reused in subsequent predictions.

In the drawings and specification, there has been set forth a preferred embodiment of the invention, and although specific terms are employed, they are used in a generic and descriptive sense only and not for purposes of limitation.

That which I claim is:

1. In a battery powered system which includes a portable battery powered device and a battery connected to said device for supplying electrical power thereto, the combination therewith of an apparatus for predicting the remaining useful life of the battery during the normal use discharge cycle of the battery, said apparatus comprising data storage means for storing a predetermined value representing the total number of usable hours expected to be obtained from a fully charged battery during a normal use discharge cycle, means for counting the number of hours of actual use of the battery, means for comparing the number of hours of actual battery use with said stored predetermined value to determine the number of hours of usable battery life remaining, means for displaying the thus determined remaining usable battery life, and means operable in response to the occurrence of a full discharge cycle of the battery in normal use updating said data storage means to store therein as said predetermined value for the expected useful life of the battery in the next normal use discharge cycle, the value for the number of hours of use actually obtained from the battery in the current discharge cycle, so that subsequent predictions of the battery life will be based upon the immediate past history of actual battery life.

2. The combination according to claim 1 wherein said battery comprises a rechargeable battery whose expected number of hours of useful life decreases with repeated discharge-recharge cycles.

3. The combination according to claim 1 wherein said apparatus comprises a microprocessor operatively connected to said battery and including a set of stored instructions for operation of said recited means.

4. The combination according to claim 1 including means for monitoring the battery voltage during the discharge cycle and sensing when the battery voltage falls to a predetermined minimum usable voltage.

5. In a battery powered system comprising a portable battery powered instrument, said instrument including microprocessor means for carrying out predetermined instrument functions, display means for displaying the results of the instrument functions, and a battery for supplying electrical power to the instrument, the combination therewith of an apparatus for predicting the remaining useful life of the battery during the discharge cycle of the battery, said apparatus residing in and operated by the same microprocessor means which is used for carrying out said instrument functions, and comprising data storage means in said microprocessor means for storing a predetermined value representing the total number of usable hours expected to be obtained from a fully charged battery during a normal use discharge cycle.

means for counting the number of hours of actual use of the battery, means in said microprocessor means for comparing the number of hours of actual battery use with said stored predetermined value to determine the number of hours of usable battery life remaining, and for displaying the thus determined remaining usable battery life on said instrument display means, means for monitoring the voltage of said battery during the discharge cycle and sensing when the battery voltage falls to a predetermined minimum usable voltage, and means operable in response to the ocurrence of a full discharge cycle of the battery in normal use for updating said data storage means to store therein as said predetermined value for the expected useful life of the battery in the next normal use discharge cycle, the value for the number of hours of use actually obtained from the battery in the current discharge cycle, so that subsequent predictions of battery life will be based upon the immediate past history of actual battery life.

6. The combination according to claim 5 wherein said battery comprises a rechargeable battery whose expected number of hours of useful life may change with repeated discharge-recharge cycles.

7. A method for predicting the remaining useful life of the battery employed in a battery powered device, comprising storing a predetermined value representing the total number of usable hours expected to be obtained from a fully charged battery during a normal use discharge cycle, counting the number of hours of actual use during a discharge cycle of the battery, comparing the number of hours of actual battery use with said stored predetermined value to determine the number of hours of usable battery life remaining, displaying the thus determined remaining usable battery life, monitoring the battery voltage during the discharge cycle and sensing when the battery voltage falls to a predetermined minimum voltage which is indicative of a full discharge cycle of the battery, and in response to the occurrence of a full discharge cycle of the battery in normal use, updating said stored predetermined value for the expected useful life of the battery, with the value for the number of hours of use actually obtained from the battery in the current discharge cycle, so that subsequent predictions of battery life will be based upon the immediate past history of actual battery life.

* * * * *